United States Patent
Chen et al.

(10) Patent No.: US 7,468,546 B2
(45) Date of Patent: Dec. 23, 2008

(54) SEMICONDUCTOR DEVICE WITH A NOISE PREVENTION STRUCTURE

(75) Inventors: Sheng-Yow Chen, Taichung (TW); Dichi Tsai, Cingshuei Township, Taichung County (TW)

(73) Assignee: Airoha Technology Corp., Hsinchu (TW)

( * ) Notice: Subject to any disclaimer, the term of this patent is extended or adjusted under 35 U.S.C. 154(b) by 153 days.

(21) Appl. No.: 11/211,187

(22) Filed: Aug. 25, 2005

(65) Prior Publication Data

US 2006/0046405 A1     Mar. 2, 2006

(30) Foreign Application Priority Data

Aug. 26, 2004   (TW) ............................... 93125487 A

(51) Int. Cl.
*H01L 23/58* (2006.01)
*H01L 23/62* (2006.01)

(52) U.S. Cl. .................. 257/665; 257/781; 257/506; 257/459

(58) Field of Classification Search ............... 438/297, 438/439; 257/355, 126, 173, 174, 503, 500, 257/501, 510, 506, 508, 490, 494, 495, 127, 257/169, 409, 484, 605, 665, 781, 459
See application file for complete search history.

(56) References Cited

U.S. PATENT DOCUMENTS

| | | | | |
|---|---|---|---|---|
| 3,909,119 A | * | 9/1975 | Wolley | 257/487 |
| 3,921,199 A | * | 11/1975 | Yuan et al. | 257/495 |
| 4,110,775 A | * | 8/1978 | Festa | 257/484 |
| 4,314,268 A | * | 2/1982 | Yoshioka et al. | 257/503 |
| 4,400,716 A | * | 8/1983 | Tani et al. | 257/495 |
| 4,799,099 A | * | 1/1989 | Verret et al. | 257/517 |
| 5,264,725 A | * | 11/1993 | Mullarkey et al. | 257/665 |
| 5,343,055 A | * | 8/1994 | Davis et al. | 438/91 |
| 5,742,075 A | * | 4/1998 | Burns et al. | 257/59 |
| 6,104,094 A | | 8/2000 | Ban et al. | |
| 6,177,712 B1 | * | 1/2001 | Miyasaka | 257/484 |
| 6,187,635 B1 | * | 2/2001 | Kaya | 438/264 |
| 6,265,742 B1 | * | 7/2001 | Gruening et al. | 257/304 |
| 6,509,210 B2 | * | 1/2003 | Park et al. | 438/131 |
| 6,788,507 B2 | * | 9/2004 | Chen et al. | 361/56 |
| 2003/0178622 A1 | * | 9/2003 | Wei et al. | 257/48 |

FOREIGN PATENT DOCUMENTS

JP     59121863 A   *   7/1984

\* cited by examiner

*Primary Examiner*—Phuc T Dang
*Assistant Examiner*—Thanh Y Tran
(74) *Attorney, Agent, or Firm*—Muncy, Geissler, Olds & Lowe, PLLC

(57) ABSTRACT

A semiconductor device. The device includes a substrate of the first semiconductor type comprising a pad region and a noise prevention structure in the substrate, on least one side of the pad region. The device further includes the substrate structure, a pad, and a dielectric layer therebetween.

6 Claims, 5 Drawing Sheets

SEMICONDUCTOR DEVICE WITH A NOISE PREVENTION STRUCTURE

BACKGROUND

The invention relates to a semiconductor device and in particular to a pad structure.

Parasitic capacitance typically exists between a pad and substrate of a semiconductor device such as an RF chip, serving as a noise delivery path.

FIG. 1 is a cross-section of a pad structure disclosed in U.S. Pat. No. 5,652,689 by Lee. Electrically isolated N-doped region 31, P wells 33 through 35, and N-doped region 32 are formed on an N-type substrate 32. The P well 33 comprises a P-doped region 33a and an N-doped region 33b, the P well 34 comprises a P-doped region 34a, and the P well region comprises a P-doped region 35a and an N-doped region 35b. A dielectric layer 28 is disposed on the substrate 27, exposing the P-doped region 34a. A pad 26 is disposed on the dielectric layer 28, electrically connecting the P-doped region 34a via a plug 29. As shown, the dielectric layer 28 is between the electrically conductive pad 26 and P wells 33, 35, and thus, parasitic capacitance is, inherently generated between the pad 26, dielectric layer 28, and P well 33, and between the pad 26, dielectric layer 28, and P well 35, serving as noise delivery paths.

FIG. 2 is a cross-section of a pad structure disclosed in TW 429522 by Huang el., wherein a substrate 100 comprises electrically isolated drain region 106 and source region 110. A dielectric layer 116 is disposed on the substrate 100, exposing the drain region 106. A pad 122 is disposed on the dielectric layer 116, electrically connecting the drain region 106 via a plug 120. As shown, the dielectric layer 116 is between the electrically conductive pad 122 and source region 110, and thus, parasitic capacitance is inherently generated between the pad 122, dielectric layer 116, and source region 110, serving as a noise delivery path.

SUMMARY

Thus, embodiments of the invention provide a semiconductor device, cutting noise delivery paths therein, and improving the electrical performance thereof.

Embodiments of the invention provide a semiconductor device comprising a substrate and noise prevention structure. The substrate, of a first semiconductor type, comprises a pad region. The noise prevention structure is formed in the substrate, on least one side of the pad region.

Embodiments of the invention further provide a semiconductor device comprising a substrate, noise prevention structure, pad, and dielectric layer. The substrate, of a first semiconductor type, comprises a pad region. The noise prevention structure is formed in the substrate, on least one side of the pad region. The pad overlies the pad region. The dielectric layer is disposed at least between the pad region and pad.

BRIEF DESCRIPTION OF THE DRAWINGS

The invention can be more fully understood by reading the subsequent detailed description in conjunction with the examples and references made to the accompanying drawings, wherein.

DETAILED DESCRIPTION

The following embodiments are intended to illustrate the invention more fully without limiting the scope of the claims, since numerous modifications and variations will be apparent to those skilled in this art.

Figure 1:
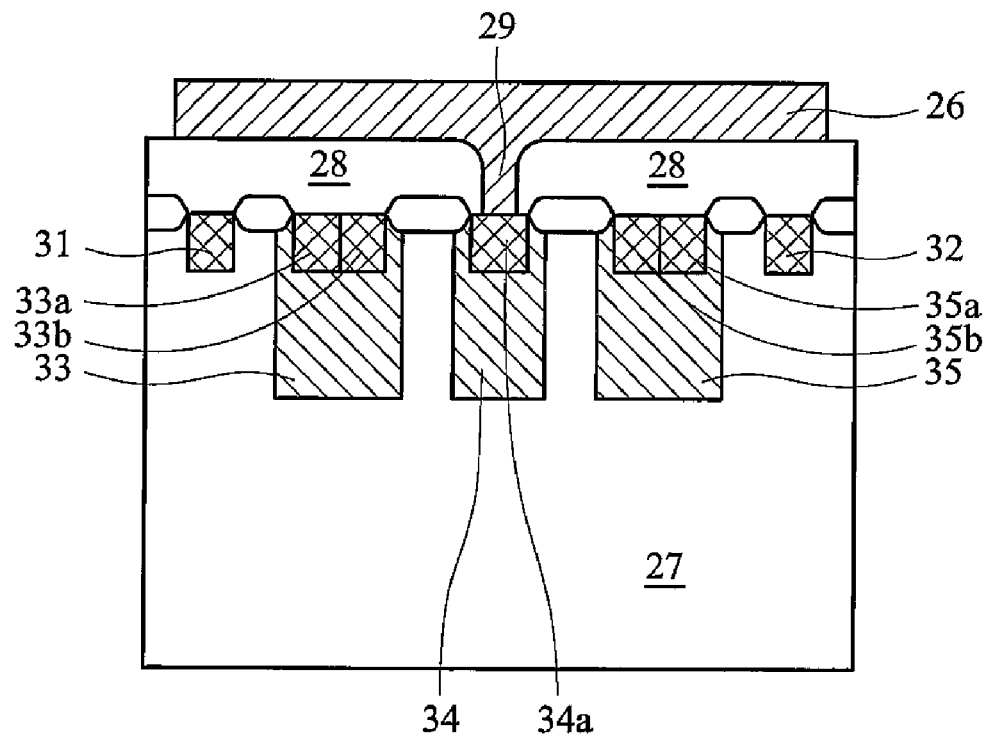
FIG. 1 is a cross-section of a pad structure disclosed in U.S. Pat. No. 5,652,689.
Figure 2:
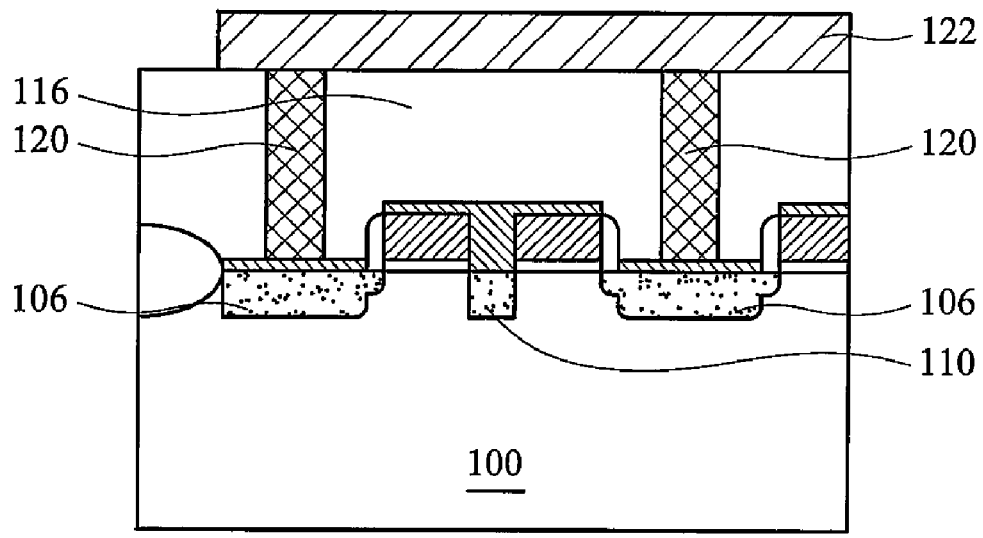
FIG. 2 is a cross-section of a pad structure disclosed in TW 429522.
Figure 3:
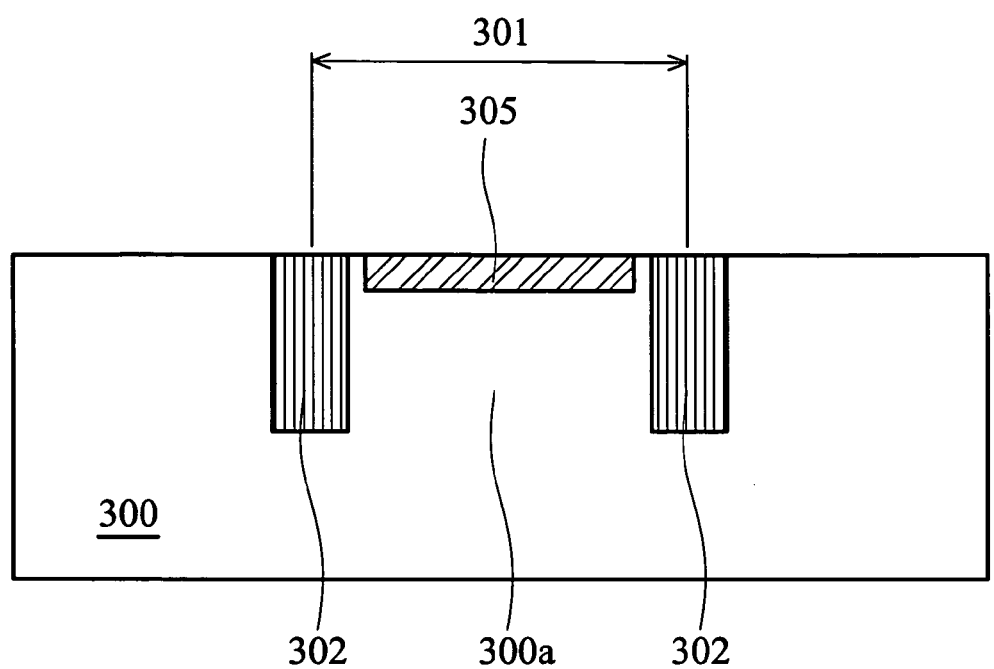
FIG. 3 is a cross-section of a semiconductor device of the first embodiment of the invention.

FIG. 3 shows a semiconductor device of the first embodiment of the invention.

In FIG. 3, a substrate 300 of a first semiconductor type, such as N type or P type, comprises a pad region 301. A noise prevention structure 302 is formed in the substrate 300, on least one side of the pad region 301. The noise prevention structure 302 may be further formed substantially around the pad region 301, or substantially across the pad region 301 as required. The noise prevention structure 302 may comprise an epitaxy of a second semiconductor type, a second well of the second semiconductor type, a trench isolation structure, or combinations thereof. The second semiconductor type is P type when the first semiconductor type is N type, and vice versa. In this embodiment, the noise prevention structure 302 comprises an epitaxy of a second semiconductor type.

Figure 4:
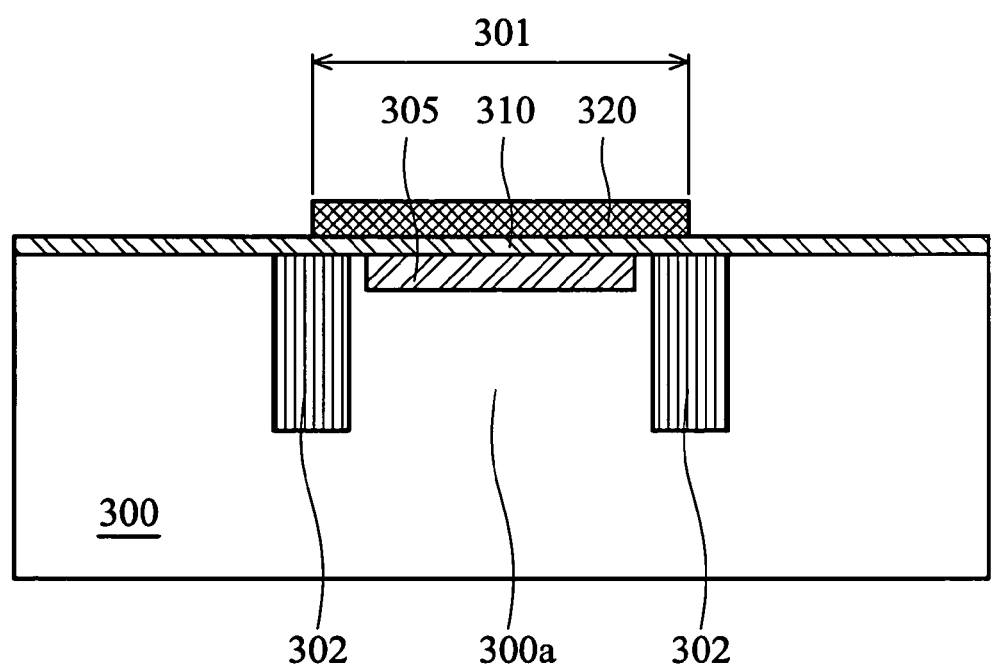
FIG. 4 is a cross-section of a semiconductor device of the second embodiment of the invention.

A well 300a of the first semiconductor type is exposed in the noise prevention structure 302 and the noise prevention structure 302 is formed around sidewalls of the well 300a. A device region 305 may be further formed in the well 300a FIG. 4 shows a semiconductor device of the second embodiment of the invention.

In this embodiment, a pad 320 overlies the pad region 301 of substrate 300 of the first embodiment, and a dielectric layer 310 is disposed between the substrate 300 and pad 320.

The noise prevention structure 302 is a high resistance structure for the substrate 300 and well 300a because semiconductor type of the substrate 300 and well 300a is different from that of the noise prevention structure 302. Thus, even if noise appears during operation of an apparatus comprising the semiconductor device of the invention resulting from parasitic capacitance between the pad 320, dielectric layer 310, and well 300a, the noise is isolated by the high resistance noise prevention structure 302, failing to negatively affect other devices (not shown) beyond the noise prevention structure 302. Thus, noise delivery is blocked, thereby improving electrical performance of the semiconductor apparatus.

Figure 5:
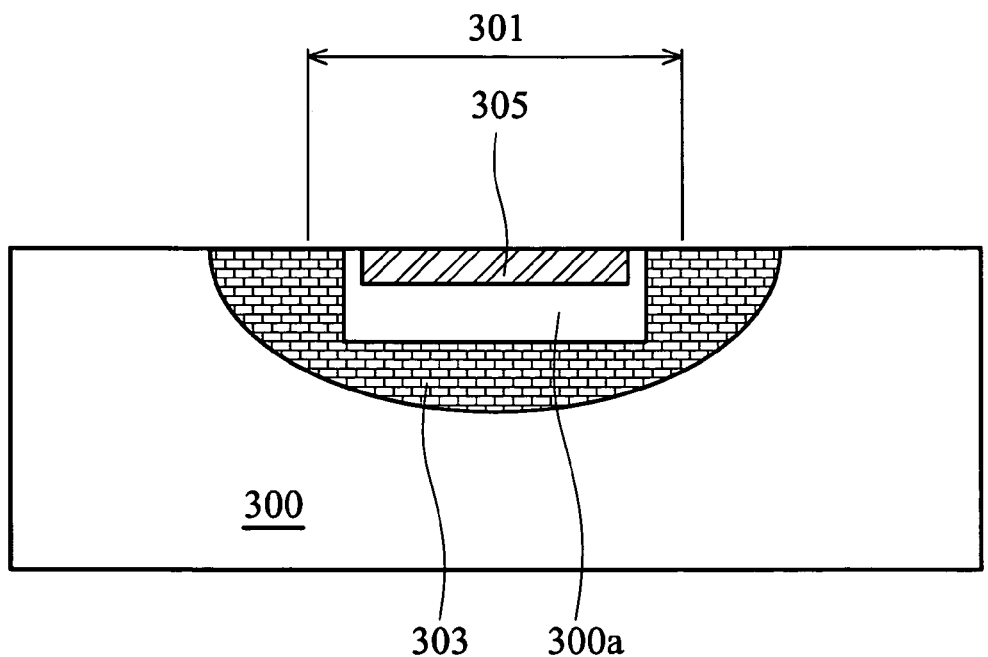
FIG. 5 is a cross-section of a semiconductor device of the third embodiment of the invention.

FIG. 5 shows a semiconductor device of the third embodiment of the invention.

Unlike the first embodiment, in this embodiment, the noise prevention structure 302 is replaced by a noise prevention structure 303, a well of the second semiconductor type. The noise prevention structure 303 is formed on one side of the pad region 301, and further between the well 300a and substrate 300. Layout of the noise prevention structure 303 may be varied. For example, the noise prevention structure 303 may be formed substantially around the pad region 301 or substantially across the pad region 301. Similarly, the second semiconductor type is P type when the first semiconductor type is N type, and vice versa.

Details regarding the substrate 300, well 300a, pad region 301, and device region 305 are the same as those described for FIG. 3, and thus, are omitted in the following.

Figure 6:
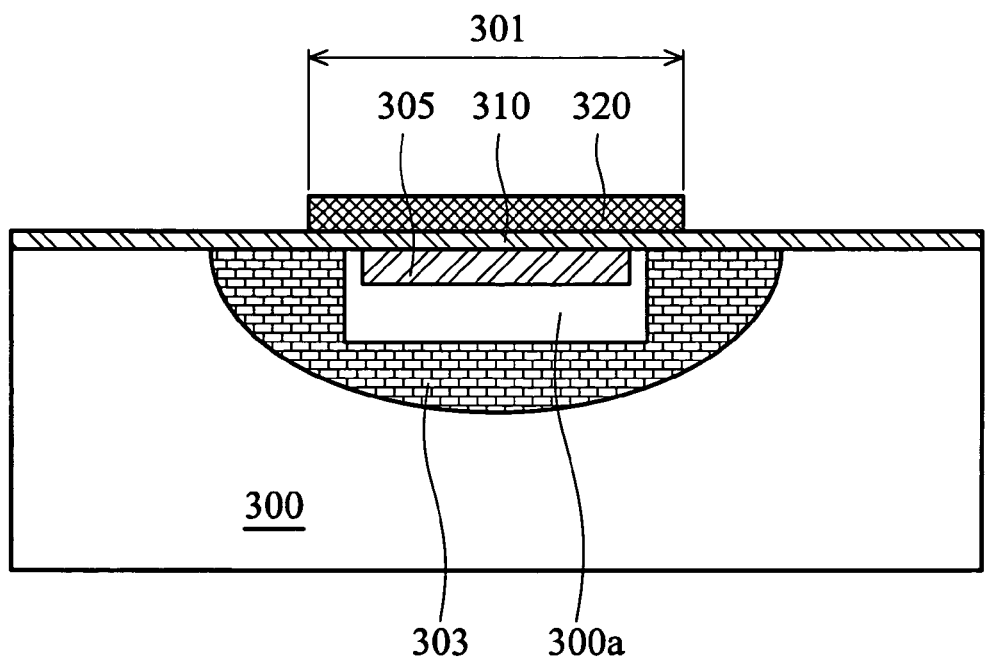
FIG. 6 is a cross-section of a semiconductor device of the fourth embodiment of the invention.

FIG. 6 shows a semiconductor device of formed fourth embodiment of the invention.

In this embodiment, a pad 320 is disposed overlying the pad region 301 of substrate 300 of the first embodiment, and a dielectric layer 310 is disposed between the substrate 300 and pad 320.

Because semiconductor type of the well 300a is different from that of the noise prevention structure 303, the well 300a and noise prevention structure 303 can be respectively electrically connected to traces with different electrical potential by any known interconnection technology. For example, the noise prevention structure 303 can be electrically connected to a ground line (not shown) when the well 300a is electrically connected to a power line (not shown), and vice versa, thereby forming a PN junction with reverse bias. Thus, even if noise appears during operation of an apparatus comprising the semiconductor device of the invention resulting from parasitic capacitance between the pad 320, dielectric layer 310, and well 300a, the noise is transmitted by transmission of the PN junction with reverse bias, failing to negatively affect other devices (not shown) beyond the noise prevention structure 303, thereby improving electrical performance of the semiconductor apparatus.

Figure 7:
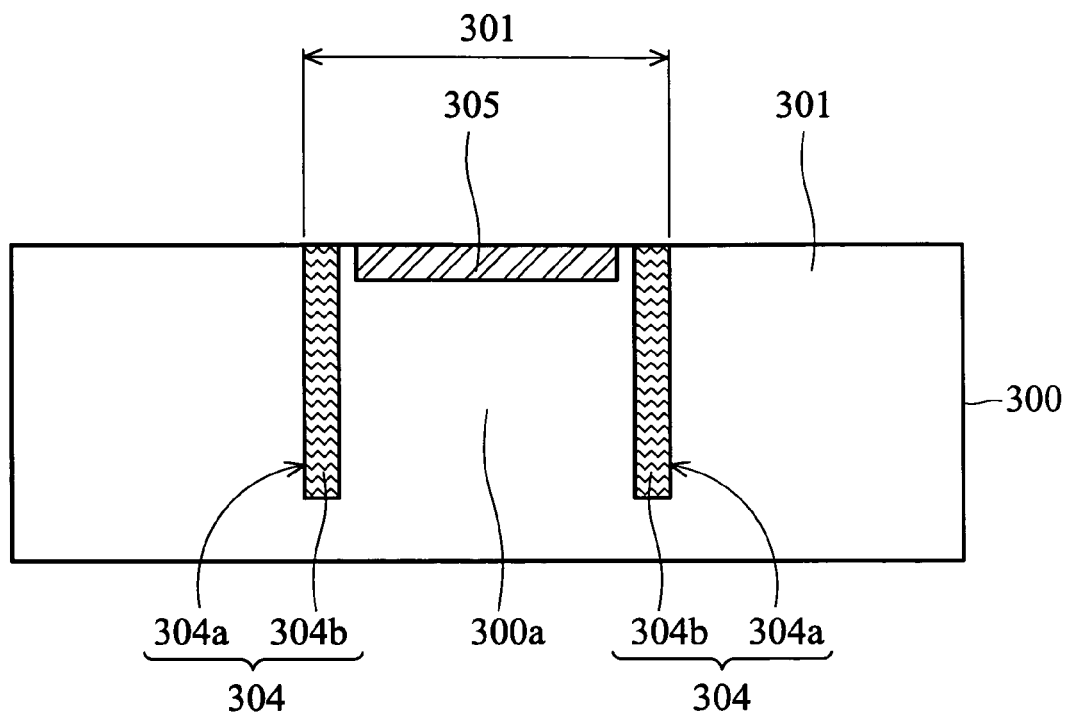
FIG. 7 is a cross-section of a semiconductor device of the fifth embodiment of the invention.

FIG. 7 shows a semiconductor device of the fifth embodiment of the invention.

Unlike the first embodiment, in this embodiment, the noise prevention structure 302 is replaced by a noise prevention structure 304, a trench isolation structure comprising a trench 304a and a dielectric material 304b filled therein. The noise prevention structure 304 is formed at one side of the pad region 301. Layout of the noise prevention structure 304 may be varied. For example, the noise prevention structure 304 may be formed substantially around the pad region 301 or substantially across the pad region 301.

Details regarding the substrate 300, well 300a, pad region 301, and device region 305 are the same as those described for FIG. 3, and thus, are omitted in the following.

Figure 8:
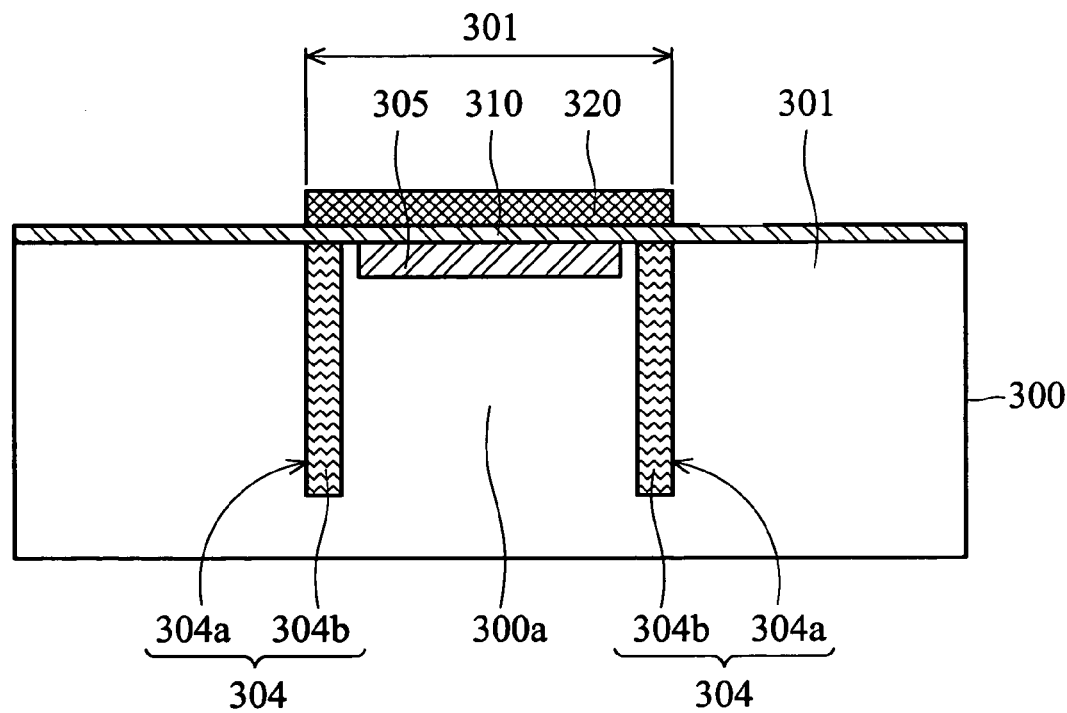
FIG. 8 is a cross-section of a semiconductor device of a sixth embodiment of the invention.

FIG. 8 shows a semiconductor device of the sixth embodiment of the invention.

In this embodiment, a pad 320 is disposed overlying the pad region 301 of substrate 300 of the first embodiment, and a dielectric layer 310 is disposed between the substrate 300 and pad 320.

The noise prevention structure 304 comprising the dielectric material 304b is a high resistance structure. Thus, even if noise appears during operation of an apparatus comprising the semiconductor device of the invention resulting from parasitic capacitance between the pad 320, dielectric layer 310, and well 300a, the noise is isolated by the high resistance noise prevention structure 304, failing to negatively affect other devices (not shown) beyond the noise prevention structure 304. Thus, noise delivery is blocked, thereby improving electrical performance of the semiconductor apparatus.

Further, combinations of noise prevent structures 302 through 304 of the first, third, and fifth embodiment may be utilized. A preferred embodiment is described as follows.

Figure 9:
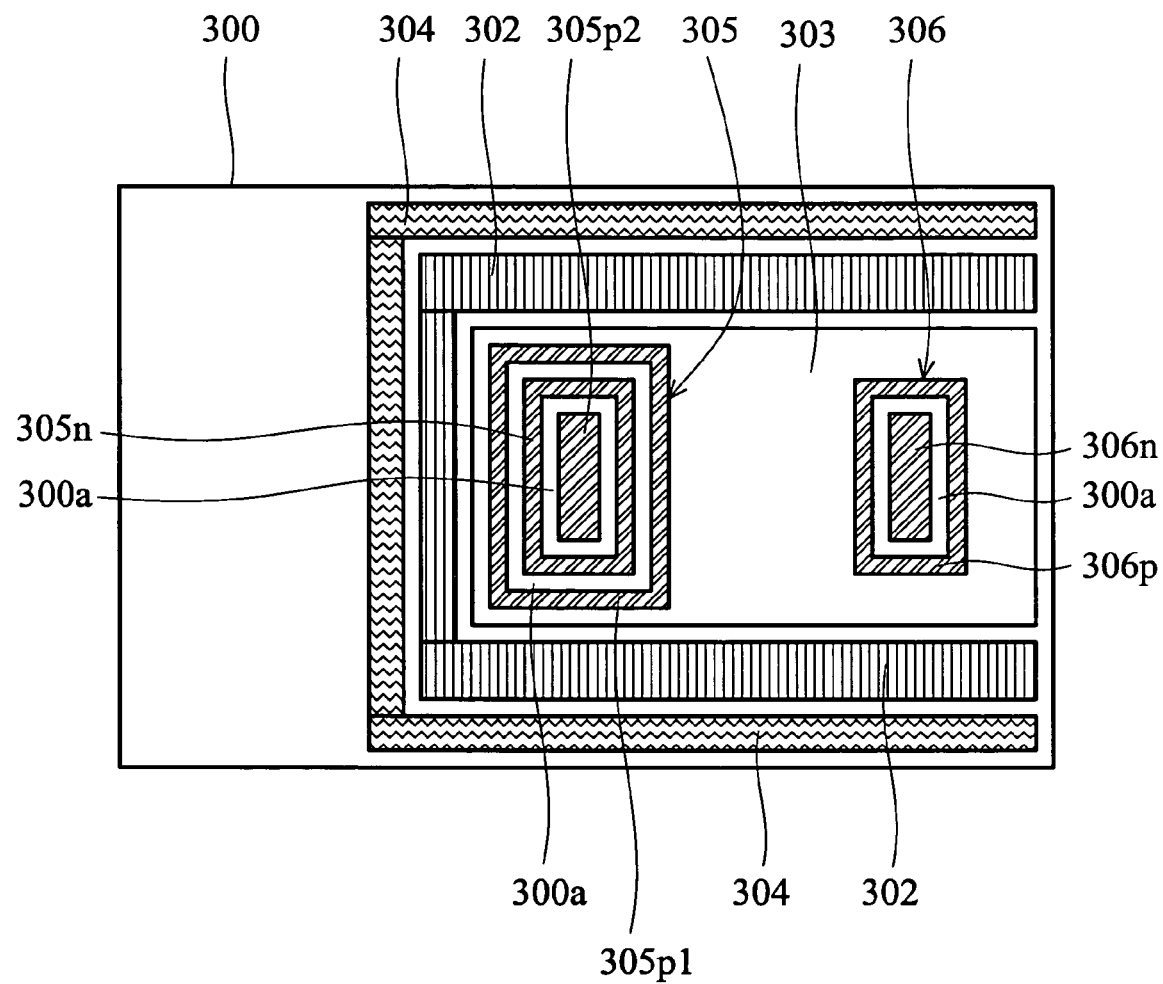
FIG. 9 is a top view of a semiconductor device under a pad of the seventh embodiment of the invention.

FIG. 9 shows a semiconductor device of the seventh embodiment of the invention.

In this embodiment, device regions 305 and 306, both comprising wells 300a, are surrounded by a noise prevention structure 303. A noise prevention structure 302 is formed beyond the noise prevention structure 303. A noise prevention structure 304 is formed beyond the noise prevention structure 302.

In a preferred embodiment, the substrate 300 is a P type substrate, and thus, the well 300a is a P type well, the noise prevention structure 302 is an N type epitaxy, the noise prevention structure 303 is an N type well with deeper doping than the well 300a. The device region 305 comprises an outer ring-shaped P type doping region 305p1, inner ring-shaped N type doping region 305n, central P type doping region 305p2, and wells 300a interposed therebetween. The device region 306 comprises an outer ring-shaped P doping region 306p, central N type doping region 306n, and well 300a interposed therebetween. The P type doping region 305p2 may be electrically connected to a subsequently formed pad (not shown). The N type doping region 305n may be electrically connected to a subsequently formed power line or power metal layer (not shown). The N type doping region 306n may be electrically connected to a subsequently formed pad (not shown). The P doping region 306p may be electrically connected to a subsequently formed ground line or ground metal layer (not shown).

Thus, the results show the efficiency of the inventive substrate structure under a pad, resulting in transmitting or isolating noise, improving electrical performance of a semiconductor apparatus, thereby achieving the described aims of the invention.

While the invention has been described by way of example and in terms of preferred embodiment, it is to be understood that the invention is not limited thereto. It is therefore intended that the following claims be interpreted as covering all such alteration and modifications as fall within the true spirit and scope of the invention.

What is claimed is:

1. A semiconductor device, comprising:
   a substrate of a first semiconductor type comprising a pad region, the pad region comprising an outer ring-shaped doping region of the first semiconductor type, a central doping region of a second semiconductor type, and a first well of the first semiconductor type interposed therebetween;
   a pad overlying the pad region, wherein the central doping region is electrically connected to the pad;
   a dielectric layer at least between the substrate and pad; and
   a noise prevention structure in the substrate, on at least one side of the pad region,
   wherein the noise prevention structure is further formed substantially across the pad region,
   wherein the noise prevention structure comprises a second well, and
   wherein the second well of the second semiconductor type is located between the first well and the substrate and isolates the first well from the substrate.

2. The device as claimed in claim 1, wherein the noise prevention structure is further substantially formed around the pad region.

3. The device as claimed in claim 1, wherein the noise prevention structure is further formed around the pad region, exposing the first well, the outer ring-shaped doping region, and the central doping region.

4. The device as claimed in claim 3, wherein the noise prevention structure comprises an epitaxy of the second semiconductor type or a trench isolation structure around the outer ring-shaped doping region.

5. The device as claimed in claim 1, wherein the first well comprises an N-doped region, a P-doped region, or combinations therof.

6. The device as claimed in claim 1, wherein the second semiconductor type is P type when the first semiconductor type is N type, and the second semiconductor type is N type when the first semiconductor type is P type.

* * * * *